(12) United States Patent
Shibib et al.

(10) Patent No.: US 7,335,565 B2
(45) Date of Patent: Feb. 26, 2008

(54) METAL-OXIDE-SEMICONDUCTOR DEVICE HAVING IMPROVED PERFORMANCE AND RELIABILITY

(75) Inventors: Muhammed Ayman Shibib, Wyomissing, PA (US); Shuming Xu, Schnecksville, PA (US)

(73) Assignee: Agere Systems Inc., Allentown, PA (US)

( * ) Notice: Subject to any disclaimer, the term of this patent is extended or adjusted under 35 U.S.C. 154(b) by 67 days.

(21) Appl. No.: 11/348,597

(22) Filed: Feb. 7, 2006

(65) Prior Publication Data

US 2006/0128085 A1 Jun. 15, 2006

Related U.S. Application Data

(62) Division of application No. 10/688,231, filed on Oct. 17, 2003, now Pat. No. 7,005,703.

(51) Int. Cl.
*H01L 21/336* (2006.01)
(52) U.S. Cl. ............ 438/296; 438/140; 438/270; 438/454; 257/E21.629
(58) Field of Classification Search ............ None
See application file for complete search history.

(56) References Cited

U.S. PATENT DOCUMENTS

| | | | | |
|---|---|---|---|---|
| 5,569,949 A | * | 10/1996 | Malhi | 257/397 |
| 5,918,137 A | * | 6/1999 | Ng et al. | 438/454 |
| 6,548,863 B2 | * | 4/2003 | Patti | 257/335 |
| 6,787,872 B2 | * | 9/2004 | Kinzer et al. | 257/492 |
| 2003/0025154 A1 | * | 2/2003 | Haynie | 257/335 |
| 2004/0222461 A1 | * | 11/2004 | Peyre-Lavigne et al. | 257/333 |

OTHER PUBLICATIONS

C.S. Kim et al., "Trenched Sinker LDMOSFET (TS-LDMOS) Structure for High Power Amplifier Application above 2 GHz," IEEE, IEDM, pp. 40.2.1-10.2.4, 2001.

* cited by examiner

*Primary Examiner*—Michael Lebentritt
*Assistant Examiner*—Kyoung Lee

(57) ABSTRACT

A method for forming a MOS device includes the steps of forming a gate proximate an upper surface of a semiconductor layer, the semiconductor layer including a substrate of a first conductivity type and a second layer of a second conductivity type; forming first and second source/drain regions of the second conductivity type in the second layer proximate the upper surface of the second layer, the first source/drain region being spaced laterally from the second source/drain region, the gate being formed at least partially between the first and second source/drain regions; and forming at least one electrically conductive trench in the second layer between the gate and the second source/drain region, the trench being formed proximate the upper surface of the semiconductor layer and extending substantially vertically through the second layer to the substrate. The step of forming the trench includes the steps of forming an insulating layer substantially lining sidewalls of the trench, and substantially filling the trench with an electrically conductive material.

18 Claims, 3 Drawing Sheets

METAL-OXIDE-SEMICONDUCTOR DEVICE HAVING IMPROVED PERFORMANCE AND RELIABILITY

CROSS-REFERENCE TO RELATED APPLICATION(S)

This application is a divisional of U.S. application Ser. No. 10/688,231, filed Oct. 17, 2003, now issued as U.S. Pat. No. 7,005,703, the disclosure of which is incorporated by reference herein.

FIELD OF THE INVENTION

The present invention relates generally to semiconductor devices, and more particularly relates to techniques for forming an MOS device having improved reliability without significantly impacting high-frequency performance.

BACKGROUND OF THE INVENTION

Power MOS devices, including laterally diffused metal-oxide-semiconductor (LDMOS) devices, are employed in a variety of applications, such as, for example, power amplifiers in wireless communications systems. In a conventional LDMOS device, hot-carrier injection (HCI) effects, current crowding in a lightly-doped drain (LDD) region and/or electric field distribution are some of the phenomena which are known to undesirably affect the performance and reliability of the device.

HCI in an MOS device generally results from heating and subsequent injection of carriers into the gate oxide of the device, which results in a localized and nonuniform buildup of interface states and oxide charges near and underneath a gate of the device. As is well known in the art, the buildup of interface states, which are typically defined as trapped charges in an interface between an upper surface of the silicon substrate and an oxide layer formed on the substrate, generally results from a high electric field distribution proximate the silicon/oxide interface. This phenomenon can produce variations in certain characteristics of the MOS device, including threshold voltage, transconductance, drain current, etc., thus undesirably affecting the performance and reliability of the device. It is well known that HCI is a strong function of the internal electric field distributions at the silicon/oxide interface of the MOS device.

In order to reduce HCI effects somewhat in an LDMOS device, it is known that the source metal, which provides electrical connection to the source region of the device, may be extended over the gate so as to form a shielding structure. The source contact may thus be used to form a Faraday shield over the gate, which helps reduce the high electric field concentration near the corners of the gate. However, while the Faraday shield may provide a limited reduction in HCI effects, it typically does not reduce current crowding and confinement in the LDD region of the device. It is this current crowding and confinement, particularly near an edge of the gate and in the thin LDD region near a silicon/oxide interface in the device, which primarily contributes to HCI.

As an added drawback, the conventional shielding structure prevents full gate metallization, which is one known method for dramatically reducing the resistance Rg of the gate, thus limiting the high-frequency performance of the LDMOS device. Since the output gain of the MOS device is inversely proportional to the gate resistance of the device, increasing the gate resistance results in a decrease in the output gain of the device, which is particularly undesirable in an amplifier application.

There exists a need, therefore, for an MOS device capable of improved performance and reliability that does not suffer from at least the above-noted deficiencies typically affecting conventional MOS devices. Furthermore, it would be desirable if such an MOS device was fully compatible with a CMOS process technology.

SUMMARY OF THE INVENTION

The present invention provides techniques for reducing undesirable effects including HCI, current crowding, and/or high electric field distribution in an MOS device, thereby improving performance and reliability without undesirably affecting high-frequency performance of the device. Moreover, the techniques of the present invention can be used to fabricate an integrated circuit (IC) device, for example, an LDMOS device, using conventional CMOS compatible process technology. Consequently, the cost of manufacturing the IC device is not significantly increased.

In accordance with one aspect of the invention, an MOS device includes a semiconductor layer comprising a substrate of a first conductivity type and a second layer of a second conductivity type formed on at least a portion of the substrate. First and second source/drain regions of the second conductivity type are formed in the second layer proximate an upper surface of the second layer, the second layer being spaced laterally from the first source/drain region. A gate is formed above the second layer proximate the upper surface of the second layer and at least partially between the first and second source/drain regions. The MOS device further includes at least one electrically conductive trench formed in the second layer between the gate and the second source/drain region, the trench being formed proximate the upper surface of the semiconductor layer and extending substantially vertically through the second layer to the substrate.

The at least one trench is preferably configured such that as a voltage at the second source/drain region increases, a depletion region spreads outward from the trench so as to substantially fill a region proximate the trench. The MOS device provides reduced HCI effects, reduced current crowding and/or a reduced peak electric field near the gate, particularly in an area proximate the upper surface of the semiconductor layer, without substantially degrading high-frequency performance. Furthermore, the MOS device is substantially compatible with a CMOS process technology.

These and other features and advantages of the present invention will become apparent from the following detailed description of illustrative embodiments thereof, which is to be read in connection with the accompanying drawings.

DETAILED DESCRIPTION OF THE PREFERRED EMBODIMENTS

The present invention will be described herein in the context of an illustrative CMOS integrated circuit fabrication technology suitable for forming discrete RF LDMOS transistors, as well as other devices and/or circuits. It should be appreciated, however, that the present invention is not limited to the fabrication of this or any particular device or circuit. Rather, the invention is more generally applicable to any MOS device in which it is desirable to alleviate effects including HCI, current crowding and/or high electric field distribution, thereby improving the performance and reliability of the device without significantly affecting high-frequency performance in the device.

Although implementations of the present invention are described herein with specific reference to an LDMOS device, it is to be appreciated that the techniques of the present invention are similarly applicable to other devices, such as, but not limited to, a vertical diffused MOS (DMOS) device, an extended drain MOS device, etc., with or without modifications thereto, as will be understood by those skilled in the art. Furthermore, although the invention will be described herein in the context of a p-channel MOS device, it is well understood by those skilled in the art that an n-channel MOS device could be formed by simply substituting opposite polarities to those given for the p-channel embodiment, and that the techniques and advantages of the present invention will similarly apply to the alternative embodiment.

It is to be understood that the various layers and/or regions shown in the accompanying figures may not be drawn to scale. Furthermore, one or more semiconductor layers of a type commonly used in such integrated circuit structures may not be explicitly shown in a given figure for ease of explanation. This does not imply that the semiconductor layer(s) not explicitly shown are omitted in the actual integrated circuit device.

Figure 1:
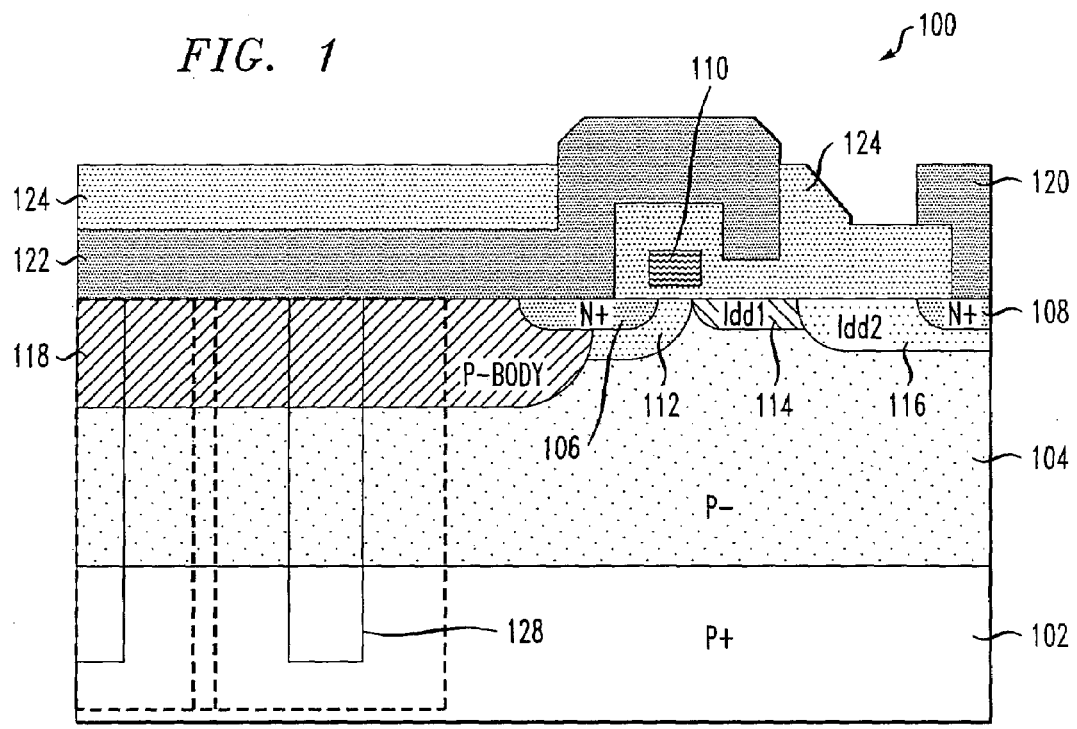
FIG. 1 is a cross-sectional view illustrating at least a portion of an LDMOS device in which the techniques of the present invention can be implemented.

FIG. 1 illustrates a cross-sectional view of at least a portion of a semiconductor wafer 100 that can be modified to implement the techniques of the invention. The wafer 100 includes an LDMOS device formed on a substrate 102. The LDMOS device includes a source region 106 and a drain region 108 formed in an epitaxial layer 104 of the wafer 100. The LDMOS device further includes a gate 110 formed above a channel region 112 of the device. The channel region 112 is at least partially formed between the source and drain regions. A drift region is generally formed in the epitaxial layer 104 of the LDMOS device which may comprise a first LDD region (ldd1) 114 and a second LDD region (ldd2) 116 formed between the channel region 112 and drain region 108. The source region 106 in the LDMOS device may include a body region (p-body) 118 formed in the epitaxial layer 104 adjacent to the source region 106 and extending laterally opposite the channel region 112. An oxide layer 124 is generally formed on an upper surface of the wafer 100 to electrically isolate the source, drain and gate areas of the device as well as to protect the device.

The LDMOS device further includes a drain contact 120 and a source contact 122, each of which may be formed in or through the oxide layer 124 and electrically connected to the drain region 108 and source region 106, respectively. Electrical contact to the source region 106 may also be made from a bottom of the substrate 102 via one or more trench sinkers 128 formed through the epitaxial layer 104 which provide a low-resistance (e.g., less than about 1 ohm per square) electrical path between the source region 106 and the substrate 102. A gate contact (not shown) is also included for providing an electrical connection to the gate 110.

Due at least in part to the relatively high electric field concentration near the corners of the gate 110 and the close relative proximity of the gate to an interface between the upper surface of the silicon and the oxide layer 124, HCI often occurs at the silicon/oxide interface near the first LDD region 114 immediately proximate the edge of the gate 110.

In order to reduce HCI in the LDMOS device, the source contact 122 may be extended over the gate 110 and ending proximate an upper surface of the wafer 100 between the gate and drain region 108 so as to form a shielding structure. The source contact 122 thus forms a Faraday shield over the gate 110 which helps distribute the high electric field concentration near the corners of the gate. Although not shown, a separate shielding structure, referred to herein as a dummy gate, may alternatively be formed in close relative proximity to the gate 110, between the gate 110 and drain region 108 and in close proximity (e.g., 200 nanometers (nm)) to the upper surface of the wafer 100. If used, the dummy gate is electrically connected (e.g., strapped) to the source region 106.

While employing a shielding structure (e.g., Faraday shield or dummy gate) may help reduce HCI degradation at a silicon/oxide interface between the oxide layer 124 and an upper surface of the epitaxial layer 104, HCI degradation will generally increase at the silicon/oxide interface near the second LDD region 116 immediately proximate an edge of the shielding structure. HCI degradation can be further reduced by lowering the doping concentration of at least the first LDD region 114. However, this will undesirably result in an increase in the on-resistance associated with the device. Thus, in a conventional LDMOS device, there is often a trade-off which exists between on-resistance and HCI effects in the device.

Figure 2:
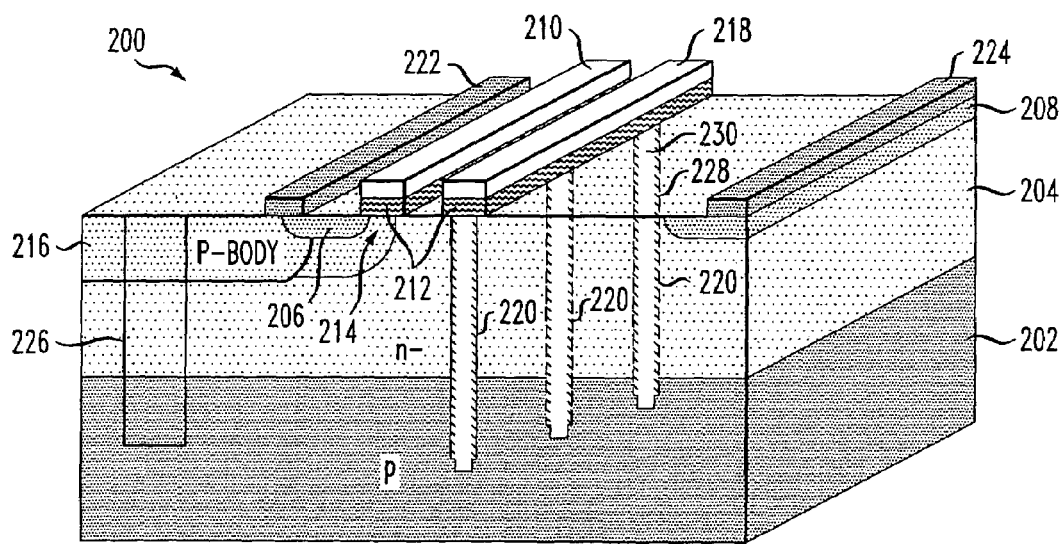
FIG. 2 is a cross-sectional view depicting at least a portion of an exemplary LDMOS device, formed in accordance with an illustrative embodiment of the present invention.

FIG. 2 illustrates a cross-sectional view of at least a portion of a semiconductor wafer 200 in which the techniques of the present invention are implemented. As previously stated, the various layers and/or regions shown in the figure may not be drawn to scale and certain commonly used semiconductor layers may have been omitted for ease of explanation. The wafer 200 includes an exemplary LDMOS device formed on a semiconductor substrate 202. The substrate 202 is commonly formed of single-crystal silicon, although alternative materials may be used, such as, but not limited to, germanium (Ge), gallium arsenide (GaAs), etc. Additionally, the substrate 202 may have been modified by adding an impurity or dopant, such as by a diffusion or implant step, to change the conductivity of the material (e.g., n-type or p-type). In a preferred embodiment of the invention, the substrate 202 is of p-type conductivity, and hence may be referred to as a p-substrate.

The term "semiconductor layer" as may be used herein refers to any semiconductor material upon which and/or in which other materials may be formed. The semiconductor layer may comprise a single layer, such as, for example, the substrate 202, or it may comprise multiple layers, such as, for example, the substrate 202 and an epitaxial layer 204. In a preferred embodiment of the invention, the epitaxial layer 204 is of n-type conductivity. The semiconductor wafer 200 comprises the substrate 202, with or without the epitaxial layer 204, and preferably includes one or more other semiconductor layers formed on the substrate. The term "wafer" is often used interchangeably with the term "silicon body," since silicon is typically employed as the semiconductor material comprising the wafer. It should be appreciated that although the present invention is illustrated herein using a portion of a semiconductor wafer, the term "wafer" may include a multiple-die wafer, a single-die wafer, or any other arrangement of semiconductor material on or in which a circuit element may be formed.

The exemplary LDMOS device includes a source region 206 and a drain region 208 formed in the epitaxial layer 204 of the wafer 200, such as by an implant or diffusion process. The source and drain regions are preferably doped, such as by an implant process, with an impurity (e.g., boron, phosphorus, etc.) of a known concentration level to selectively change the conductivity of the material as desired. Preferably, the source and drain regions 206, 208 have a conductivity type associated therewith which is opposite a conductivity type of the substrate 202, so that active regions can be formed in the device. In a preferred embodiment of the invention, the source and drain regions 206, 208 are of n-type conductivity. A low-resistance (e.g., less than about ten ohms per square) electrical path between the source region 206 and the substrate 202 may be provided by forming one or more trench sinkers 226 through the epitaxial layer 204 of the wafer 200. The trench sinkers 226 may be formed in a conventional manner, such as, for example, by forming openings in the epitaxial layer 204 (e.g., by photolithographic patterning and etching) to expose the substrate 202, and filling the openings with an electrically conductive material, as will be understood by those skilled in the art. In a preferred embodiment of the invention, the trench sinkers 226 are of p-type conductivity.

It is to be appreciated that, in the case of a simple MOS device, because the MOS device is symmetrical in nature, and thus bidirectional, the assignment of source and drain designations in the MOS device is essentially arbitrary. Therefore, the source and drain regions may be referred to generally as first and second source/drain regions, respectively, where "source/drain" in this context denotes a source region or a drain region. In an LDMOS device, which is generally not bidirectional, such source and drain designations may not be arbitrarily assigned.

The exemplary LDMOS device includes an body region 216 formed in the epitaxial layer 204, such as by a conventional implant and diffusion process. The body region 216 is preferably formed adjacent to the source region 206 and extends laterally in a direction opposite the drain region 208. The body region 216 is preferably doped, such as by a conventional implant step, with an impurity of a known concentration level to selectively change the conductivity of the material as desired. Preferably, the body region 216 has a conductivity type associated therewith which is opposite a conductivity type of the source region 206. In a preferred embodiment of the invention, the body region 216 is of p-type conductivity, and hence may be referred to as a p-body.

A channel region 214 is formed proximate an upper surface of the exemplary LDMOS device, just beneath an interface between the epitaxial layer 204 and an insulating layer 212, which in a preferred embodiment is formed of an oxide (e.g., silicon dioxide ($SiO_2$)), although other suitable insulating materials may be used (e.g., silicon nitride). Since the epitaxial layer 204 often comprises silicon, this interface may be referred to as a silicon/oxide interface. The channel region 214 is formed at least partially below and adjacent to the source region 206 in the LDMOS device. The channel region 214 may be formed of a material having the same conductivity type as the substrate, preferably p-type in the exemplary device, and may therefore be referred to as a p-channel.

The exemplary LDMOS device further includes a gate 210 formed above at least a portion of the channel region 214 and proximate the silicon/oxide interface of the wafer 200. The gate may comprise, for example, polysilicon material, although alternative suitable materials (e.g., metal) may be similarly employed. The gate 210 is electrically isolated from an active area of the wafer via an insulating layer 212. Since the insulating layer under the gate 210 preferably comprises an oxide (e.g., silicon dioxide), this insulating layer 212 may be referred to herein as gate oxide.

A shielding electrode 218, which may be referred to herein as a dummy gate, is preferably formed in the exemplary LDMOS device between the gate 210 and the drain region 208. The dummy gate 218, which may comprise, for example, polysilicon, is spaced laterally from the gate 210 and preferably substantially non-overlapping relative to the gate. Although not shown, the dummy gate 218 in the exemplary LDMOS device, when used, is preferably electrically connected (e.g., strapped) to the source region 206, such as by forming a conductive layer (e.g., aluminum, gold, etc.) between the dummy gate and the source region. Like the gate 210, the dummy gate 218 is preferably formed on the insulating layer 212 for electrically isolating the dummy gate from an active region of the wafer. As previously explained, the dummy gate 218 beneficially reduces HCI proximate the silicon/oxide interface in the vicinity of the corners of the gate 210. A dummy gate suitable for use in conjunction with the present invention can be found, for example, in a related U.S. application Ser. No. 10/623,983 entitled "Shielding Structure for Use in a Metal-Oxide-Semiconductor Device," filed on Jul. 15, 2003, which is incorporated by reference herein.

In a preferred embodiment of the invention, the dummy gate 218 is formed concurrently with the gate 210 in the same processing step. In this manner, the dummy gate 218 is preferably self-aligned to the gate 210. The thickness of the insulating layer 212 (e.g., silicon dioxide) beneath the gate 210 and dummy gate 218 may be substantially the same. Thus, like the gate 210, the dummy gate 218 is preferably formed in close relative proximity (e.g., 200 nanometers (nm)) to the silicon/oxide interface of the wafer 200. It is to be appreciated, however, that the relative thicknesses of the insulating layer 212 under the gate 210 and dummy gate 218 need not be the same. Furthermore, although the size and shape of the dummy gate 218 relative to the gate 210 may be substantially the same, the configuration of the gate and/or dummy gate are not limited to the precise size or shape shown, but may be formed in alternative configurations, as will be understood by those skilled in the art.

A source contact 222 and a drain contact 224 may be formed on an upper surface of the wafer 200, such as, for example, by conventional photolithographic patterning and etching, for providing an electrical connection to the source region 206 and drain region 208, respectively, as will be understood by those skilled in the art. The source and drain contacts may comprise a metal, such as, for example, aluminum or gold. Connection to the source region 206 may also be made through a bottom surface of the substrate since the trench sinkers 226 provide a relatively low-resistance electrical path between the source region 206 and the substrate 202, as previously explained. A gate contact (not shown) may also be formed on the upper surface of the wafer 200, or in an alternative location, for providing an electrical connection to the gate 210.

An important aspect of the present invention is the formation of one or more electrically conductive trenches 220 in the epitaxial layer 204 of the LDMOS device, between the channel region 214 and drain region 208. A given trench 220 may comprise a groove (e.g., v-groove), diffused sinker, or an alternative structure for providing a low-resistance electrical path between the upper surface of the wafer and the substrate 202. Although a single trench may be used, in a preferred embodiment of the invention a plurality of trenches 220 are utilized, each of the trenches preferably extending substantially vertically through the epitaxial layer 204, between the upper surface of the wafer 200 and the substrate 202.

The trenches 220 may be formed in a conventional manner, such as, for example, by forming openings or v-grooves in the epitaxial layer 204 (e.g., by photolithographic patterning and etching) to expose the substrate 202, and filling the trenches with an electrically conductive material (e.g., doped polysilicon, metal, silicide, etc.), as will be understood by those skilled in the art. Alternatively, the trenches 220 may comprise diffused sinkers, which may be formed in a conventional manner, for example, by doping the surface of the silicon with a heavy impurity predeposition (e.g., boron) or implanting a very high dose ion implant, which is then driven at a high temperature down to the substrate. In essence, since the trenches are electrically connected to the substrate, which like the source region 206 is typically at ground potential, the addition of the trenches 220 advantageously extends the concept and associated benefits of the dummy gate 218 deeper into the epitaxial layer of the device.

The trenches 220 reshape a depletion layer formed in the device in order to protect a region proximate the gate 210 from experiencing a high electric field concentration. This is accomplished, in at least one aspect, by configuring the trenches 220 so as to control a spread of the depletion layer and/or a distribution of an electric field in the device. Therefore, in accordance with one aspect of the invention, the trenches 220 are preferably formed in the epitaxial layer 204 such that as a voltage at the drain region 208 increases, the depletion layer spreads from the trenches to substantially fill a region between the trenches. In this manner, the region between the drain region 208 and gate 210 substantially pinches off, thereby reducing the current concentration, and thus the electric field concentration, proximate the gate. In accordance with another aspect of the invention, trenches may also be placed around a periphery of an end of the drain region 208 in order to effectively limit the total drain area, and thus limit a gate-to-drain capacitance of the device. Reducing the gate-to-drain capacitance advantageously improves the high-frequency performance of the device.

Traditionally, the current density, and thus the electric field concentration, will be significantly higher along the channel region 214 near the gate 210, particularly where the channel region curves, thereby increasing the likelihood that HCI will occur. The trenches 220 may beneficially control a curvature of the channel region 214, in at least one aspect, by controlling the spread of the depletion layer and the distribution of the electric field proximate the gate 210 so as to reduce HCI effects. Conventionally, the shaping of the channel region and depletion layer is controlled by the LDD regions (e.g., 114 and 116 shown in FIG. 1). These LDD regions are typically formed as very shallow (e.g., in a range from about 0.05 micron to about 0.5 micron) implant regions in the epitaxial layer proximate the silicon/oxide interface. Since the bulk of the current in the device will flow through the LDD regions, the electric field will inherently be concentrated near the silicon/oxide interface, thus increasing the likelihood of HCI.

The addition of the trenches 220 beneficially allows the doping concentration of at least a portion of the epitaxial layer 204 to be significantly increased, such as, for example, by at least a factor of two in comparison to the doping level of a standard LDMOS device (e.g., about $2 \times 10^{12}$ to $4 \times 10^{12}$ atoms per square centimeter, compared to a typical doping concentration of about $1 \times 10^{12}$ to $2 \times 10^{12}$ atoms per square centimeter), without an appreciable increase in HCI. In this manner, one or more conventional LDD regions may be omitted, with the epitaxial layer 204 and trenches 220 replacing the function of the LDD regions. Since the epitaxial layer 204 is formed significantly deeper compared to the LDD regions, the current in the LDMOS device can be more easily distributed rather than being concentrated near the silicon/oxide interface, thus contributing to the reduction in HCI effects. Moreover, by increasing the doping concentration of the epitaxial layer, an on-resistance of the device, which is typically a function of the doping level of the LDD region and/or epitaxial layer, is also advantageously reduced. Thus, by forming an MOS device in accordance with the techniques of the present invention, a reduction in on-resistance and HCI effects can be concurrently achieved.

The number and spacing of the trenches 220 relative to one another will be based, at least in part, on the doping concentration of the epitaxial layer 204. In an illustrative embodiment of the invention, the trenches may be spaced from one another at a distance of about two to three microns in an n-type epitaxial layer having a doping concentration on the order of about $10^{16}$ atoms per cubic centimeter. For a given trench spacing, the number of trenches optimally utilized will depend, at least in part, on the width of the drain region 208. For instance, as the width of the drain region increases, the number of trenches 220 is preferably increased accordingly in order to sustain the same relative benefit.

In a preferred embodiment, at least a portion of the trenches 220 comprises an insulating material 228, such as, for example, an oxide (e.g., silicon dioxide), lining the walls forming the trenches, and an electrically conductive material 230, such as, for example, polysilicon, substantially filling the trenches. The polysilicon material used to fill the trenches is preferably doped with an impurity (e.g., boron or phosphorous) of a known concentration level so as to form a low-resistance electrical path (e.g., one ohm per square) in the trenches. Although not required, the insulating material 228 lining the walls of the trenches 220 helps control an out-diffusion of the more heavily doped conductive material 230 into the more lightly doped epitaxial layer 204.

FIGS. 3A-3D depict steps in an illustrative methodology which may be used in forming the exemplary LDMOS device shown in FIG. 2, in accordance with one embodiment of the present invention. The illustrative methodology will be described in the context of a conventional CMOS-compatible semiconductor fabrication process technology. It is to be understood that the invention is not limited to this or any particular methodology for fabricating the device. Furthermore, as previously stated, the various layers and/or regions shown in the figures may not be drawn to scale and certain commonly used semiconductor layers may have been omitted for ease of explanation.

Figure 3A:
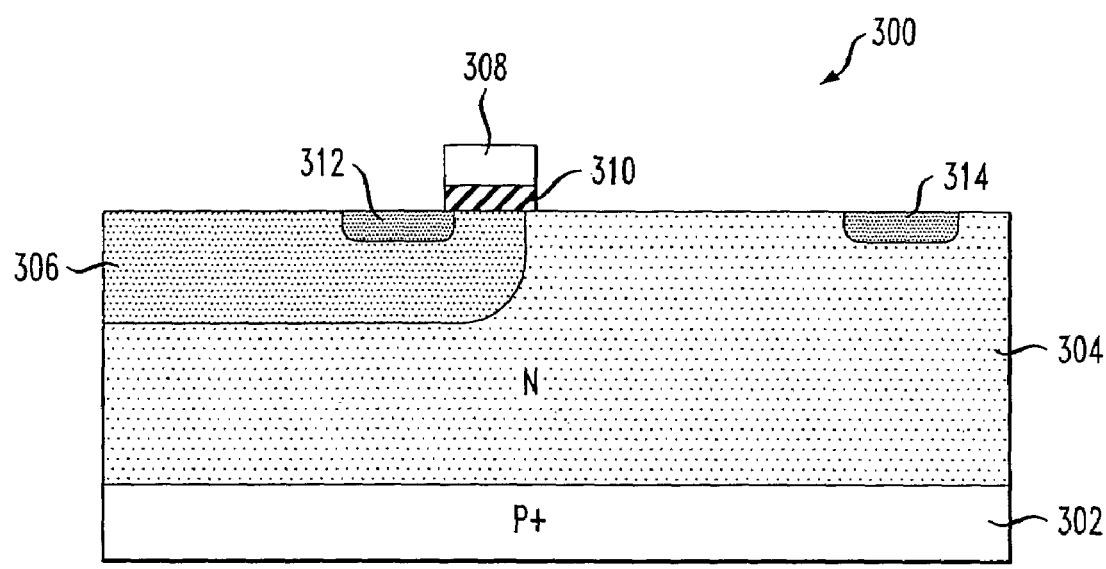
FIGS. 3A through 3D are cross-sectional views depicting steps in an illustrative semiconductor fabrication process which may be used in forming the exemplary LDMOS device shown in FIG. 2.

FIG. 3A depicts a cross section of at least a portion of an exemplary semiconductor wafer 300 in which the techniques of the present invention may be implemented. The wafer 300 includes a substrate 302 and an epitaxial layer 304 formed on the substrate 302. The substrate 302 is preferably a p+ type substrate having a high conductivity, although an n+ type substrate may alternatively be employed. As will be understood by those skilled in the art, a p+substrate may be formed by adding a p-type impurity or dopant (e.g., boron) of a desired concentration (e.g., about $5 \times 10^{18}$ to about $5 \times 10^{19}$ atoms) to the substrate material, such as by a diffusion or implant step, to change the conductivity of the material as desired. The epitaxial layer 304 is then grown over the entire surface of the wafer. The epitaxial layer 304 may also be modified by adding an n-type impurity. A breakdown voltage of the resulting transistor structure is determined, at least in part, by the thickness and impurity concentration of the epitaxial layer 304.

A P-body region 306 is formed in the epitaxial layer 304 such as, for example, by using a deep diffusion or implant step. During the diffusion step, a p-type impurity (e.g., boron) of a known concentration level is preferably used. A gate 308 is formed on an upper surface of an oxide layer 310 in the LDMOS device. The gate 308 may be fabricated from a polycrystalline silicon (polysilicon) layer formed over the thin (e.g., about 300-400 angstroms) oxide layer 310, such as, for example, using a chemical vapor deposition (CVD) technique. The oxide layer 310 under the gate 308 is often referred to as gate oxide. The polysilicon layer is generally patterned using, for example, a conventional photolithographic process, followed by an etching step (e.g., dry etching) to form gate 308, as will be understood by those skilled in the art. Although not shown, a dummy gate may also be fabricated on the oxide layer 310. The dummy gate, if used, is preferably spaced laterally from the gate 308 in a direction opposite the P-body region 306. Like the gate 308, the dummy gate may comprise polysilicon material.

A source region 312 is formed in the P-body region 306 and a drain region 314 is formed in the epitaxial region 304. The source and drain regions 312, 314 may be formed, for example, by diffusing or implanting an n-type impurity (e.g., arsenic or phosphorous) of a known concentration level into respective regions 306, 304 of the device. The source region 312 preferably uses a peripheral end of the gate 308 to at least partially define the source region, and thus the source region 312 may be considered to be self-aligned with the gate 308.

Figure 3B:
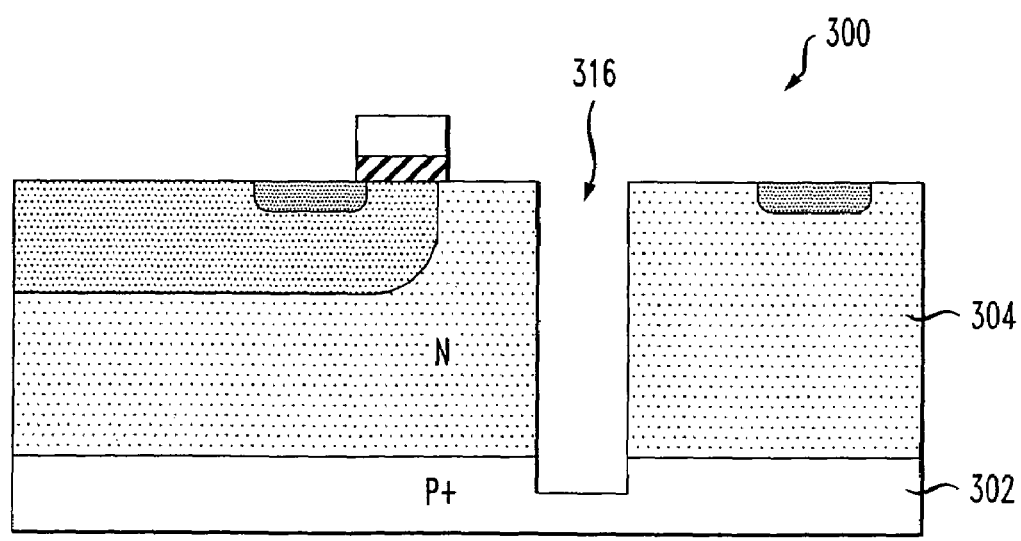

FIG. 3B illustrates a process of forming openings 316 in the wafer 300 in which conductive trenches will be formed. The openings 316 may be formed by depositing a layer of photoresist (not shown) of the upper surface of the wafer 300 and using a conventional photolithographic patterning step followed by an etching step to remove unwanted portions of the wafer. The openings 316 are preferably formed (e.g., using reactive ion etching (RIE), dry etching, etc.) through the epitaxial layer 304 to expose the substrate 302 as shown.

Figure 3C:
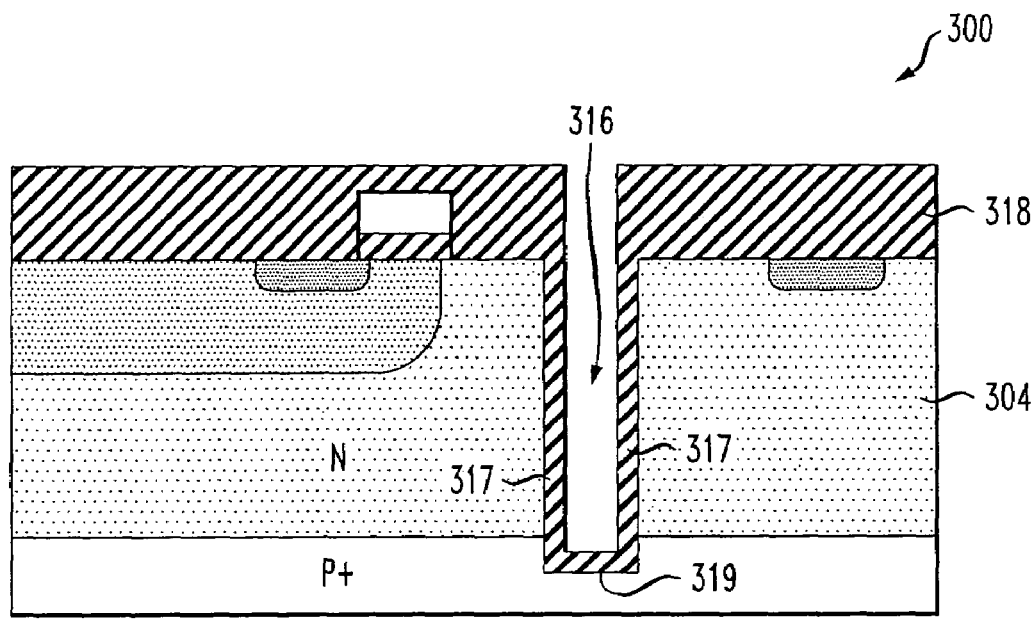

FIG. 3C depicts a step of forming a layer of oxide 318 over at least sidewalls 317 of the openings 316. The oxide layer 318 may comprise an insulating material such as, but not limited to, silicon dioxide. The oxide layer 318 may be formed of a desired thickness (e.g., about 300-400 angstroms) similar to the gate oxide layer 310 shown in FIG. 3A, for example, using a conventional oxidation process. In an illustrative oxidation process, about 50 angstroms of oxide may be grown, such as by a thermal oxidation step, and about 300 angstroms of oxide may be deposited, such as by a chemical vapor deposition (CVD) step, on at least the sidewalls 317 of the openings 316. A layer of oxide 318 may also be formed on a bottom 319 of the openings 316. As explained above, while the oxide layer 318 coating the sidewalls 317 of the openings 316 is not a requirement of the invention, such oxide layer is preferred in that it provides a barrier to help prevent the out-diffusion of conductive material (not shown), used to fill the openings, into the epitaxial layer 304 of the wafer 300.

Figure 3D:
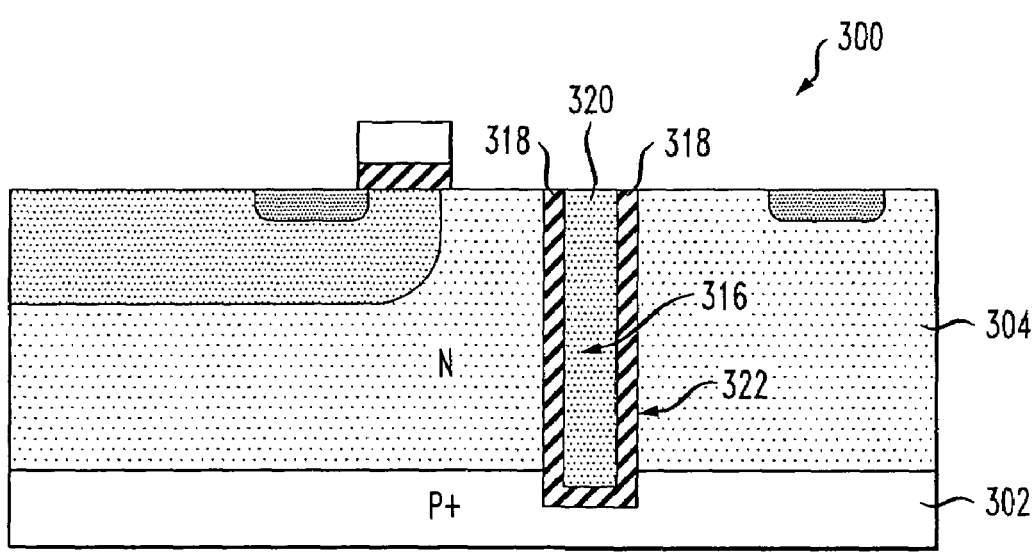
Figure 1:
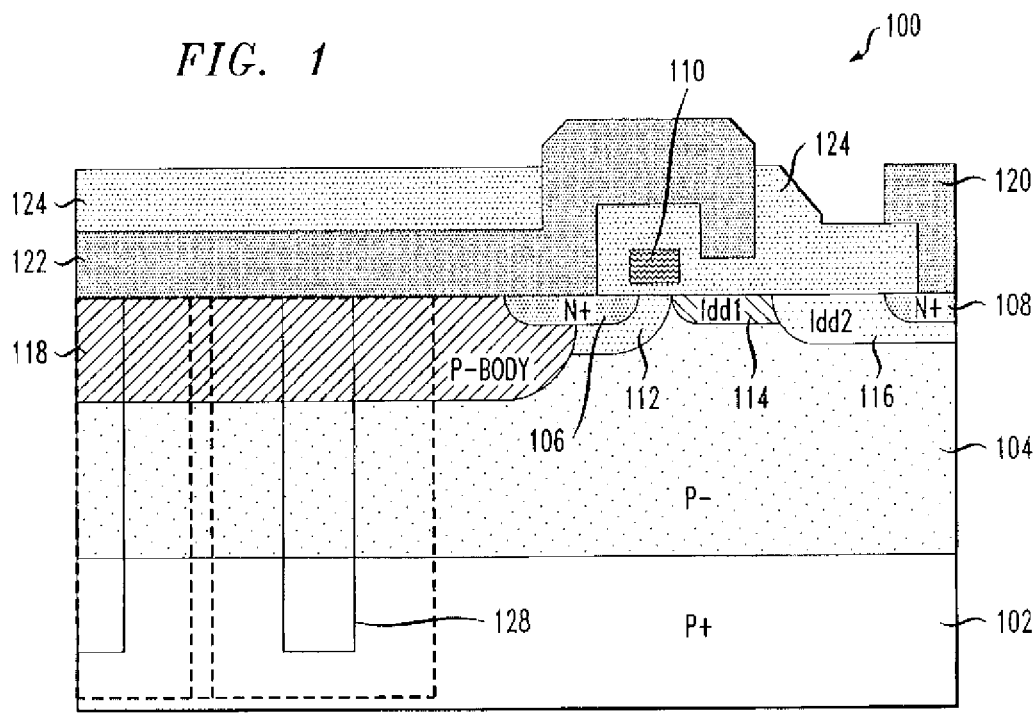
Figure 2:
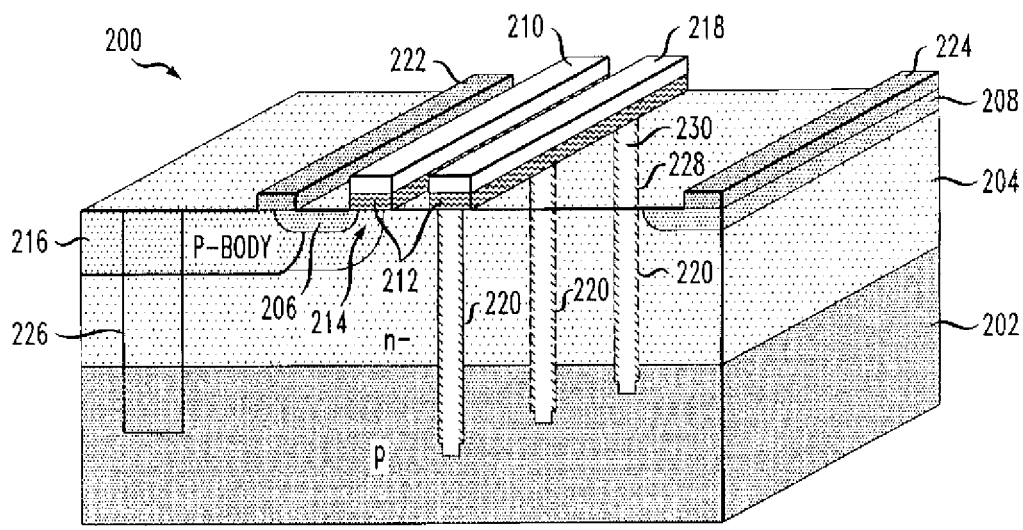
Figure 3A:
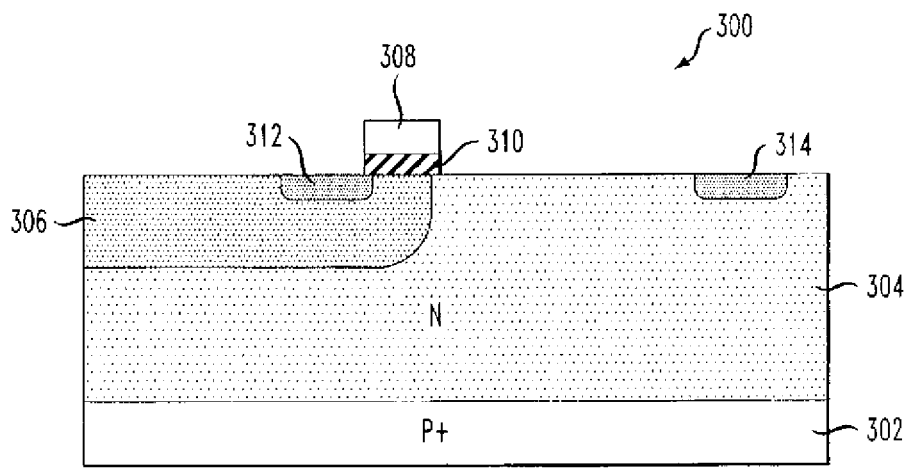
Figure 3B:
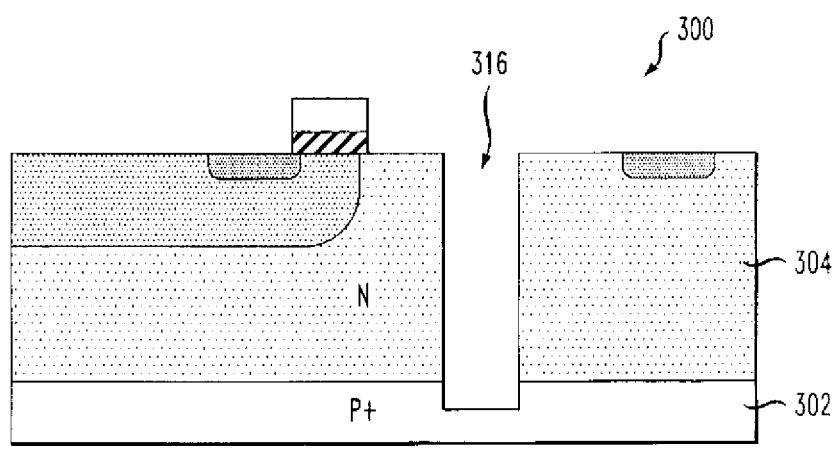
Figure 3C:
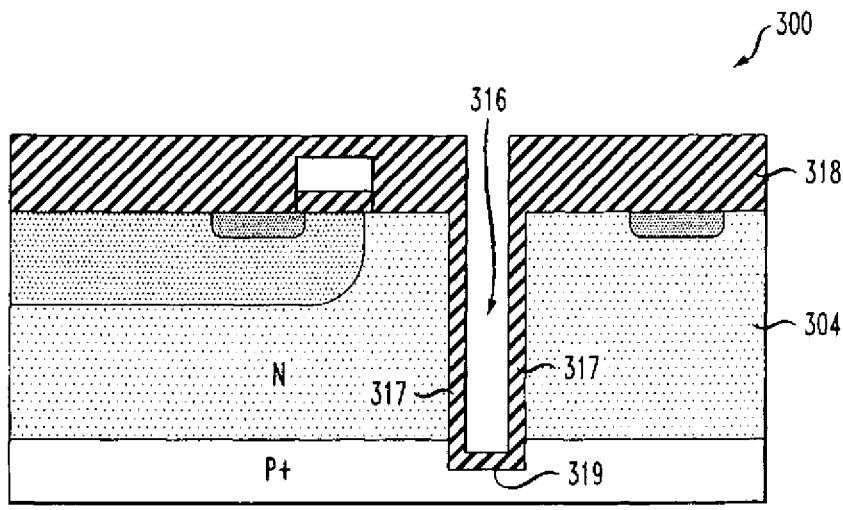
Figure 3D:
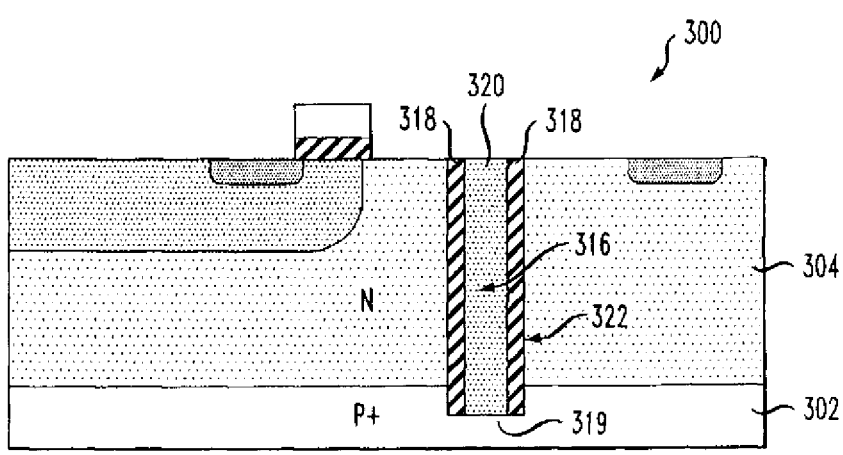

FIG. 3D illustrates a plug formation process. During this process, the oxide layer 318 is substantially removed from at least the bottom portion 319 (see FIG. 3C) of the openings 316, using, for example, a conventional etching step (e.g., an RIE step, dry etching, etc.) to expose the substrate 302 and yet leave the oxide layer 318 on the sidewalls of the openings 316 substantially intact. A conductive material 320, such as, for example, doped polysilicon, metal (e.g., aluminum), etc., is then deposited in the openings 316 so as to substantially fill the openings. The conductive material in the openings 316 forms conductive vias 322 through the epitaxial layer 304 and provide a substantially low-resistance electrical path between the substrate 302 and the upper surface of the wafer 300. The oxide layer 318 substantially lines at least the sidewalls of the conductive vias 322, thereby preventing the conductive material 320 from out-diffusing into the epitaxial layer 304, as previously stated.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A method for forming a metal-oxide-semiconductor (MOS) device, comprising the steps of:

forming a gate proximate an upper surface of a semiconductor layer, the semiconductor layer comprising a substrate of a first conductivity type and a second layer of a second conductivity type;

forming first and second source/drain regions of the second conductivity type in the second layer proximate the upper surface of the second layer, the first source/drain region being spaced laterally from the second source/drain region, the gate being formed at least partially between the first and second source/drain regions; and forming at least one electrically conductive trench in the second layer between the gate and the second source/drain region, the at least one trench being formed proximate the upper surface of the semiconductor layer and extending substantially vertically through the second layer to the substrate;

wherein the step of forming the at least one trench comprises the steps of forming an insulating layer substantially lining sidewalls of the trench, and substantially filling the trench with an electrically conductive material.

2. The method of claim 1, wherein the at least one trench is configured such that as a voltage at the second source/drain region increases, a depletion region spreads from the trench to substantially fill a region proximate the trench, thereby reducing hot carrier injection in the device.

3. The method of claim 1, further comprising the step of forming a second electrically conductive trench in the second layer between the gate and the second source/drain region, the second trench being formed proximate the upper surface of the semiconductor layer and extending substantially vertically through the second layer to the substrate, the at least first and second trenches being spaced apart relative to one another and configured such that as a voltage at the second source/drain region increases, a depletion region spreads from the trenches to substantially fill a region between the trenches, thereby reducing hot carrier injection in the device.

4. The method of claim 1, further comprising the step of forming a shielding structure proximate the upper surface of the semiconductor layer and between the gate and the second source/drain region, the shielding structure being electrically connected to the first source/drain region, the shielding structure being spaced laterally from the gate and being substantially non-overlapping relative to the gate.

5. The method of claim 4, wherein the at least one trench is formed proximate the shielding structure.

6. The method of claim 1, wherein the second layer comprises an epitaxial layer.

7. The method of claim 1, wherein the insulating material comprises an oxide and the electrically conductive material comprises polysilicon.

8. The method of claim 1, wherein the device comprises a diffused MOS (DMOS) device.

9. The method of claim 1, wherein the device comprises a lateral DMOS (LDMOS) device.

10. The method of claim 1, wherein the first source/drain region comprises a source region and the second source/drain region comprises a drain region.

11. The method of claim 1, wherein the step of forming the at least one trench comprises forming a v-groove in the second layer between the gate and the second source/drain region.

12. The method of claim 1, wherein the step of forming the at least one trench comprises forming a diffused sinker in the second layer between the gate and the second source/drain region.

13. The method of claim 1, further comprising the step of forming a plurality of electrically conductive trenches in the second layer between the gate and the second source/drain region, the trenches being formed proximate the upper surface of the semiconductor layer and extending substantially vertically through the second layer to the substrate, the trenches being spaced apart relative to one another and configured such that as a voltage at the second source/drain region increases, a depletion region spreads from the trenches to substantially fill a region between the trenches, thereby reducing hot carrier injection in the device.

14. The method of claim 13, wherein the trenches are spaced apart relative to one another and distributed substantially uniformly throughout a region between the gate and second source/drain region.

15. A method for forming an integrated circuit (IC) device comprising one or more metal-oxide semiconductor (MOS) devices, the method comprising the steps of:

forming a gate proximate an upper surface of a semiconductor layer, the semiconductor layer comprising a substrate of a first conductivity type and a second layer of a second conductivity type;

forming first and second source/drain regions of the second conductivity type in the second layer proximate the upper surface of the second layer, the first source/drain region being spaced laterally from the second source/drain region, the gate being formed at least partially between the first and second source/drain regions; and forming at least one electrically conductive trench in the second layer between the gate and the second source/drain region, the at least one trench being formed proximate the upper surface of the semiconductor layer and extending substantially vertically through the second layer to the substrate;

wherein the step of forming the at least one trench comprises the steps of forming an insulating layer substantially lining sidewalls of the trench, and substantially filling the trench with an electrically conductive material.

16. The method of claim 15, wherein the at least one trench is configured such that as a voltage at the second source/drain region increases, a depletion region spreads from the trench to substantially fill a region proximate the trench, thereby reducing hot carrier injection in the device.

17. The method of claim 15, further comprising the step of forming a second electrically conductive trench in the second layer between the gate and the second source/drain region, the second trench being formed proximate the upper surface of the semiconductor layer and extending substantially vertically through the second layer to the substrate, the at least first and second trenches being spaced apart relative to one another and configured such that as a voltage at the second source/drain region increases, a depletion region spreads from the trenches to substantially fill a region between the trenches, thereby reducing hot carrier injection in the device.

18. The method of claim 15, further comprising the step of forming a shielding structure proximate the upper surface of the semiconductor layer and between the gate and the second source/drain region, the shielding structure being electrically connected to the first source/drain region, the shielding structure being spaced laterally from the gate and being substantially non-overlapping relative to the gate.

* * * * *

UNITED STATES PATENT AND TRADEMARK OFFICE
CERTIFICATE OF CORRECTION

PATENT NO. : 7,335,565 B2  
APPLICATION NO. : 11/348597  
DATED : February 26, 2008  
INVENTOR(S) : Muhammed Ayman Shibib and Shuming Xu Page 1 of 4

It is certified that error appears in the above-identified patent and that said Letters Patent is hereby corrected as shown below:

In the Drawings

In the formal drawings, the bottom portion 319 shown in FIG. 3C is also shown in FIG. 3D.

As such, we respectfully request that the drawings be replaced by the attached replacement drawing set with the corrected FIG. 3D.

In the Specifications

Column 9, lines 61-67 of the issued patent describes FIG. 3D and should read:

> FIG. 3D illustrates a plug formation process. During this process, the oxide layer 318 is substantially removed from at least the bottom portion 319 (see FIG. 3C) of the openings 316, using, for example, a conventional etching step (e.g., an RIE step, dry etching, etc.) to expose the substrate 302 and yet leave the oxide layer 318 on the sidewalls of the openings 316 substantially intact.

Signed and Sealed this  
Thirtieth Day of July, 2013

Teresa Stanek Rea  
*Acting Director of the United States Patent and Trademark Office*